United States Patent [19]
Berti et al.

[11] Patent Number: 5,567,651
[45] Date of Patent: Oct. 22, 1996

[54] SELF-ALIGNED COBALT SILICIDE ON MOS INTEGRATED CIRCUITS

[75] Inventors: Antonio C. Berti; Stephen P. Baranowski, both of Marlborough, Mass.

[73] Assignee: Digital Equipment Corporation, Maynard, Mass.

[21] Appl. No.: 487,573

[22] Filed: Jun. 7, 1995

Related U.S. Application Data

[63] Continuation of Ser. No. 372,852, Jan. 13, 1995, abandoned, which is a continuation of Ser. No. 240,603, May 10, 1994, abandoned, which is a continuation of Ser. No. 844,233, Mar. 2, 1992, abandoned.

[51] Int. Cl.$^6$ ................................................. H01L 21/441
[52] U.S. Cl. ........................ 437/200; 437/41; 437/247; 148/DIG. 147
[58] Field of Search .............................. 437/200, 41 SM, 437/247; 148/DIG. 19, DIG. 147

[56] References Cited

U.S. PATENT DOCUMENTS

| | | |
|---|---|---|
| 4,378,628 | 4/1983 | Levinstein et al. . |
| 4,908,331 | 3/1990 | Raaijmakers .................. 437/200 X |
| 4,920,073 | 4/1990 | Wei et al. ...................... 148/DIG. 147 |
| 4,923,822 | 5/1990 | Wang et al. ..................... 437/200 X |
| 5,047,367 | 9/1991 | Wei et al. ............................... 437/200 |

OTHER PUBLICATIONS

Wolf, S. "Silion Processing For the VLSI Era", vol. 2, Lattice Press, Sunset Beach, Calif, 1990, pp. 150–152 (no month).

Ghandhi et al., "VLSI Fabrication Principles", 1983 by John Wiley & Sons, Inc., USA, pp. 435–437 (no month).

*Primary Examiner*—John S. Maples
*Attorney, Agent, or Firm*—Denis G. Maloney; Arthur W. Fisher

[57] ABSTRACT

A method of forming cobalt silicide on source/drain regions and polysilicon gate areas of an MOS integrated circuit uses an improved technique to prevent unwanted oxidation of cobalt or growth of silicide on other areas of device. A thin titanium nitride (or titanium tungsten) film is deposited on top of a cobalt film following the steps of patterning the polysilicon gate, source/drain implant and sidewall oxide spacer deposition and etch. The titanium nitride film allows formation of defect-free cobalt silicide during an elevated-temperature anneal. Without the titanium nitride film, the cobalt is likely to oxidize and/or form cobalt silicide in unwanted regions of the device, which can cause device failure.

15 Claims, 2 Drawing Sheets

SELF-ALIGNED COBALT SILICIDE ON MOS INTEGRATED CIRCUITS

This application is a continuation of application Ser. No. 08/372,852 filed Jan. 13, 1995, now abandoned, which is a continuation of Ser. No. 08/240,603 filed May 10, 1994, now abandoned, which is a continuation of Ser. No. 07/844,233, filed Mar. 2, 1992, now abandoned.

BACKGROUND OF THE INVENTION

This invention relates to integrated circuit manufacture, and more particularly to a method for forming self-aligned silicided regions on MOS devices.

In the manufacture of MOS integrated circuits, a commonly-used practice is to form silicide on source/drain regions and on polysilicon gates. This practice has become increasing important for very high density devices where the feature size is reduced to a fraction of a micrometer. The purpose of the silicide is to provide good ohmic contacts, reduce the sheet resistivity of source/drain regions and polysilicon interconnections, increase the effective contact area, and provide an etch stop.

One of the preferred materials useful in forming silicided source/drain and polysilicon gate regions in MOS processes is cobalt. The advantages of using cobalt instead of alternative materials such as titanium, platinum, or palladium are that cobalt silicide provides low resistivity, allows shallow junctions, allows lower-temperature processing, has a reduced tendency for forming diode-like interfaces, and etchants for cobalt silicide are stable and can be stored in premixed form indefinitely.

The use of cobalt as a self-aligned silicide material has presented problems in manufacture of high-density integrated circuit devices, due to the tendency to form unwanted cobalt silicide in areas extending onto the insulating sidewall spacers used to self-align the silicided regions. The sidewall spacer is needed to isolate the polysilicon gate from the active areas, and overgrowth of silicide onto these areas can render the device inoperative due to a short. The problem of overgrowth increases as the density increases, because the distance is decreased for which overgrowth causes a catastrophic failure.

Various techniques would reduce the tendency for overgrowth of cobalt silicide in MOS processes. For example, the thickness of the cobalt coating could be decreased, but this results in a reduction in the quality of the cobalt silicide coverage in the areas where it is wanted, i.e., on the source/drain regions. Likewise, the anneal temperature could be reduced, but again this reduces the quality of cobalt silicide in needed areas at the same time as in unwanted areas. Oxygen can be introduced into the chamber during the anneal operation, which decreases overgrowth, but again reduces the quality of silicide growing on the needed areas.

An explanation of the advantages of using cobalt silicide instead of titanium silicide is described by Broadbent et al, "Application of Self-Aligned $CoSi_2$ Interconnection in Submicrometer CMOS Transistors," IEEE Trans. on Electron Devices, November 1989, pp. 2240–46. A gate leakage problem in devices having cobalt silicide is reported by Swartz et al in "Gate Isolation after Cobalt Silicide Processing," Journal of Electronic Materials, Vol. 19, No. 2, 1990, p. 171; the gate leakage is said to correlate with the presence of an etch-resistant cobalt residue on sidewall spacer surfaces, and it was noted that an oxidation treatment reduced the leakage.

SUMMARY OF THE INVENTION

In accordance with one embodiment of the invention, a method of forming cobalt silicide on source/drain regions and polysilicon gate areas of an MOS integrated circuit uses an improved technique to prevent unwanted oxidation of cobalt or growth of silicide on other areas of device. A thin titanium nitride or titanium tungsten film is deposited on top of a cobalt film following the steps of patterning the polysilicon gate, source/drain implant and sidewall oxide spacer deposition and etch. The titanium nitride or titanium tungsten film allows formation of defect-free cobalt silicide on the source/drain regions and polysilicon gate areas during an elevated-temperature anneal. Without the titanium nitride or titanium tungsten film, the cobalt is likely to oxidize and/or form cobalt silicide in unwanted regions of the device, such as on the sidewall spacers, which can cause device failure.

The process of forming cobalt silicide using this sacrificial titanium nitride or titanium tungsten cap has been found to have a large process window; i.e., there is a broad range of allowable variations in process conditions such as temperature, time, layer thickness, temperature profile in the anneal operation, etc. Silicide overgrowth on areas such as the sidewall spacers, and undergrowth of silicide in areas where it is needed, can be substantially eliminated, resulting in improved yields with no significant increase in process complexity.

BRIEF DESCRIPTION OF THE DRAWINGS

The novel features believed characteristic of the invention are set forth in the appended claims. The invention itself, however, as well as other features and advantages thereof, will be best understood by reference to the detailed description of a specific embodiment, when read in conjunction with the accompanying drawings, wherein:

DETAILED DESCRIPTION OF SPECIFIC EMBODIMENT

Figure 1A:
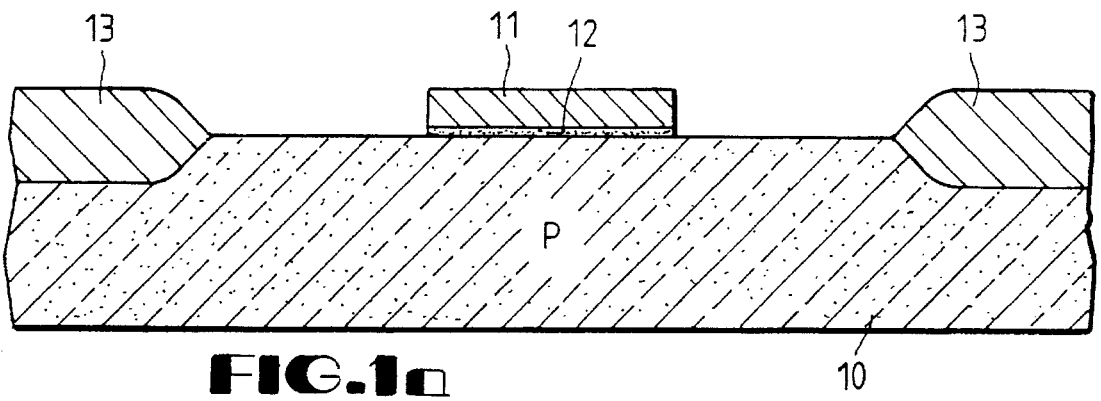
FIGS. 1a–1e are elevation views in section of a small part of a semiconductor wafer showing the formation of an MOS transistor, at successive stages in the manufacture, according to one embodiment of the invention, with FIGS. 1c and 1d being an enlarged view of only a part of the view of FIGS. 1a and 1b.
Figure 1B:
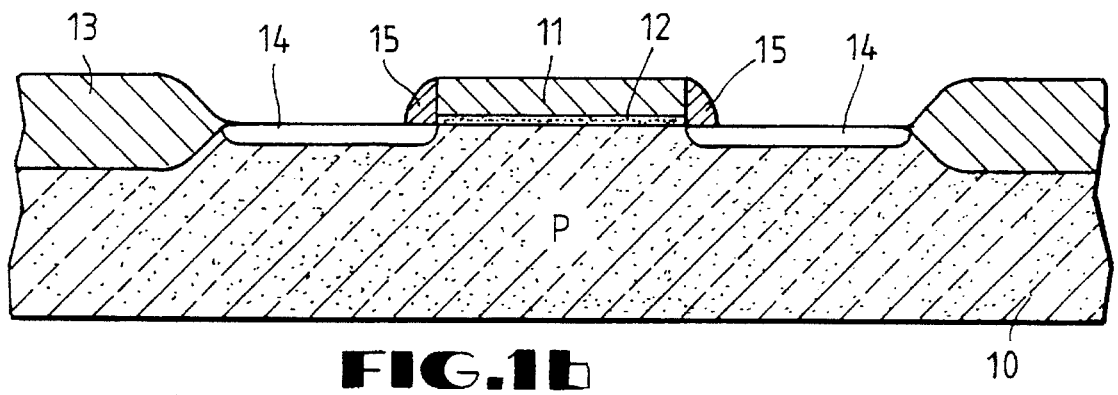

Referring to FIG. 1a, a method of making MOS integrated circuit devices, according to one embodiment of the invention, includes forming a transistor in a face of a silicon wafer 10 by applying a polysilicon gate 11 over a gate oxide coating 12 in an active area surrounded by thick field oxide 13. The gate 11 is formed by depositing a layer of polysilicon on the entire face and patterning it by photomasking and etching, in the usual manner, leaving gates over thin gate oxide 12 and interconnections between transistors extending across the field oxide 13. As seen in FIG. 1b, N+ source/drain regions 14 are created by ion implantation of arsenic or phosphorus, using the gate 11 and the field oxide 13 as a mask. Although a process for forming an N-channel transistor is illustrated here, the features of the invention are applicable as well to P-channel transistors, in which case P+ source/drain regions would be formed using boron implantation. The N+ implanted regions 14 are later driven in by a high temperature operation. The N+ source/drain regions also extend along the face to provide interconnections between transistors. In high density devices, the depth of the source/drain regions is shallow, and so silicide, is needed to lower the sheet resistivity. The polysilicon of the gate 11 is also implanted to render it low resistivity material, when the source/drain implant is done. Before or after the source/drain implant, sidewall spacers 15 are created, as also seen in FIG. 1b, by first depositing a conformal coating of silicon oxide then etching by a method such as reactive ion etch to uniformly remove a given amount of silicon oxide to leave the sidewall spacers 15 where the thickness is greater; this etch removes all of the exposed conformal oxide from the remainder of the face of the wafer, i.e., over the source/drain regions 14 and over the gates 11.

Figure 1C:
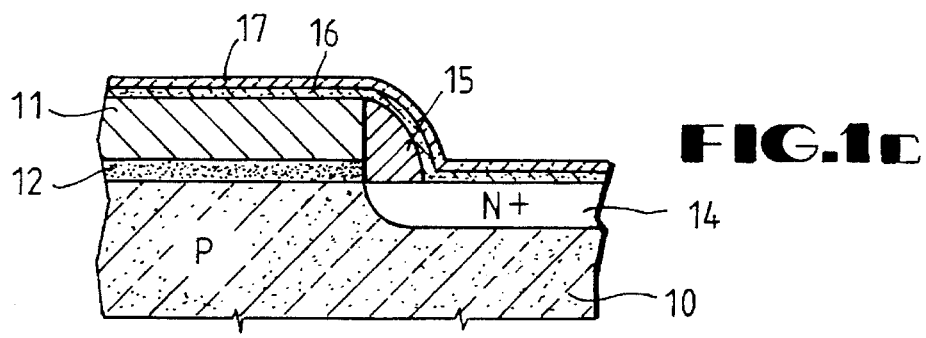

According to the invention, as seen in FIG. 1c, a coating 16 of cobalt is deposited on the face of the wafer, by sputtering, for example. The thickness of the cobalt coating 16 is about 165–300 Å, and it extends across the gate 11, source/drains regions 15, and all other exposed surfaces of the face of the wafer 10. In one example, cobalt is sputtered while heating the wafer 10 to about 150° C. using a 1000 V field and at a deposition rate of about 4 Å/sec, in an atmosphere of argon. On top of the cobalt, a thinner layer 17 of titanium nitride or titanium tungsten is applied, by again by sputtering while still in the chamber, to a thickness of about 50-to-150 Å, also over all surfaces of the face of the wafer. In an example, the deposition rate for titanium nitride is about 10 Å/sec in an atmosphere of argon and nitrogen. If titanium tungsten is used, it can be deposited from a titanium tungsten target in an atmosphere of argon.

Figure 1D:
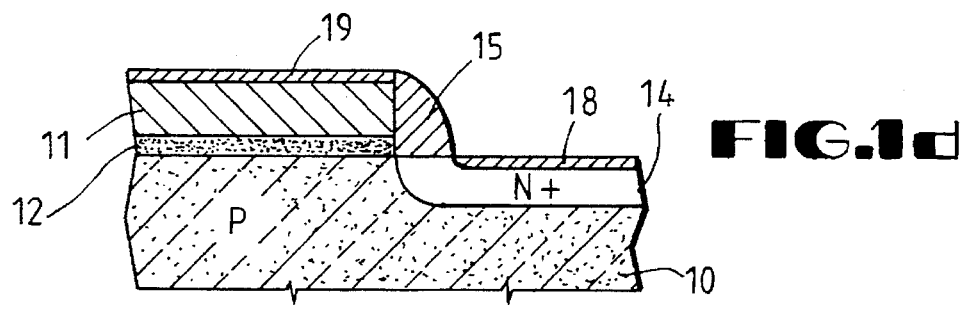

The wafer is next subjected to a first heat treatment performed in a commercially available rapid thermal annealer. In a nitrogen flow, the wafer temperature is ramped up at 10° C./sec to about 460° C., held at 460° C. for 90-sec, then ramped down at 10° C./sec to about 260° C. before removal of the wafers. This first heat treatment causes creation of cobalt silicide CoSi regions 18 and 19 over the source/drain regions and polysilicon gates 11 as seen in FIG. 1d at the interface between cobalt layer 16 and the exposed silicon. Part of the silicon of the source/drain region (and the gate 11) will be consumed as the silicide is formed; it is found that silicon is consumed at a ratio of about 1:1, i.e., the thickness of silicide is about the same as the depth of silicon consumed. Cobalt is consumed at a ratio of about 3:1, i.e., the thickness of the silicide is about three times the depth of the cobalt consumed. The unconsumed cobalt of layer 16 and the titanium nitride coating 17 are now removed by an etch treatment, as also illustrated in FIG. 1d.

Following the first heat treatment, this selective etch to remove unwanted cobalt and titanium nitride (or titanium tungsten) may employ a mixture of phosphoric, acetic and nitric acids and hydrogen peroxide, with the wafer emersed for 30-min at 55° C. This etch removes cobalt and titanium nitride but not cobalt silicide or silicon oxide.

A second heat treatment is performed after the selective etch, for the purpose of converting more of the cobalt silicide regions 18 and 19 from CoSi to the low-resistivity $CoSi_2$ phase. This treatment is also in the rapid thermal annealer and uses a ramp up at 25° C./sec to about 700° C., held for 60-sec, then ramped down at 25° C./sec. Since there is no longer a source of cobalt, the titanium nitride coating 17 (removed by the etch) is not needed to prevent overgrowth of silicide on the oxide during this second heat treatment.

Figure 1E:
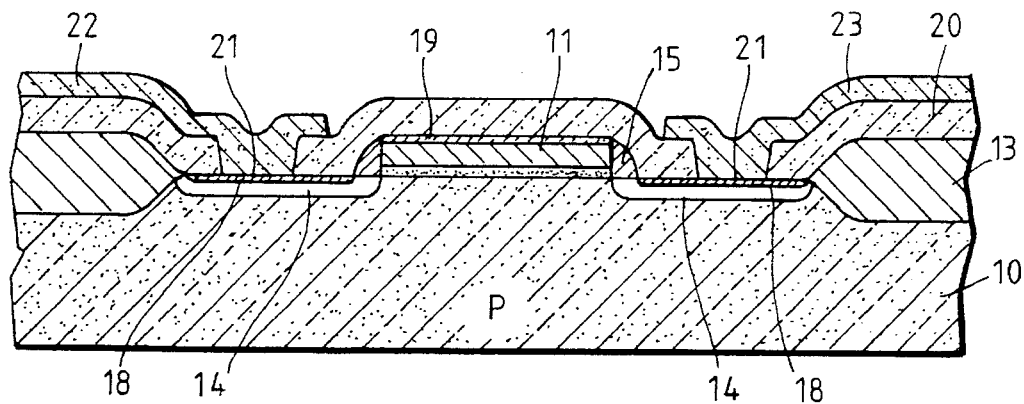
Figure 2:
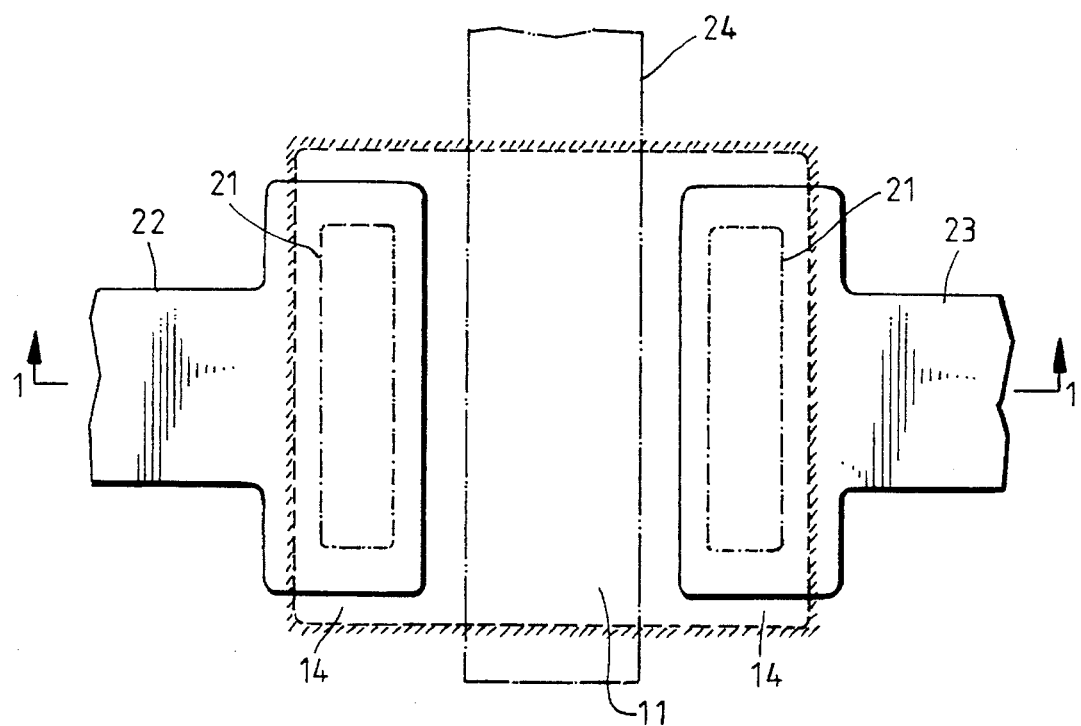
FIG. 2 is a plan view of the device of FIG. 1e, with the section of FIG. 1e being taken along the line 1—1 in FIG. 2.

Referring to FIG. 1e, the fabrication process is completed in the usual manner by applying a coating 20 of deposited oxide to the top face of the wafer, then opening contact areas 21 by a photoresist mask and etch where source and drain contacts are to be made to the low-resistance silicided regions 18. Metallization is then deposited over the face of the wafer and patterned using another photoresist mask and etch to leave contacts and interconnections 22 and 23. As seen in the top view of FIG. 2, the gate 11 extends along the face over the field oxide 13 to provide a connection 24 to the gate of the transistor.

The mechanism provided by the titanium nitride coating 17 responsible for the improved suppression of unwanted cobalt silicide growth on silicon oxide areas during the first anneal is not well understood. It is speculated that because the titanium nitride 17 eliminates the free surface atop the cobalt layer 16, a vacancy exchange mechanism which allows the silicon to diffuse up into the cobalt (the cause of overgrowth) is eliminated.

The examples given above refer to a thickness for the cap 17 of about 50-to-150 Å, but thicknesses of from 25 h to 500 Å have been used successfully (the thinner range is preferred for process simplicity), and rapid thermal annealer temperatures from 420° C. to 550° C. have been successfully used without causing silicidation of the spacer 15. Thicknesses of the cap 17 greater than about 150 Å are harder to etch off.

Thus, while the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

What is claimed is:

1. A method of making a semiconductor device, comprising the steps of:

a) applying a gate layer at a face of a silicon body;

b) forming sidewall spacers composed of oxide at edges of said gate layer the sidewall spacers having a narrow width compared to a width of said gate layer;

c) applying a first layer comprising cobalt to exposed areas of said face, said first layer extending from said exposed areas across said narrow width of said sidewall spacers and access said gate layer;

d) applying a second layer including titanium nitride or titanium tungsten over said first layer;

e) heating said body at a temperature of 420° C. to 550° C. to cause formation of cobalt monosilicide on said gate layer; and heating said body to a temperature in excess of said first temperature range to convert the cobalt monosilicide into cobalt disilicide.

2. A method according to claim 1 wherein said gate layer comprises polycrystalline silicon.

3. A method according to claim 1 including the step of forming source/drain regions in said exposed areas of said face adjacent said gate layer.

4. A method according to claim 3 wherein said cobalt silicide is formed in surfaces of said source/drain regions.

5. A method according to claim 1 wherein said first layer is less than about 300 Å in thickness, and said second layer is about 50 to 150 Å in thickness.

6. A method of making an MSS transistor device, comprising the steps of:

a) applying a polysilicon gate layer at a face of a silicon body and patterning said gate layer to leave a gate at a transistor area of said face;

b) forming sidewall spacers at opposite edges of said gate, the sidewall spacers having a narrow width compared to a width of said gate;

c) applying a first layer comprising cobalt of a first thickness to exposed areas of said transistor area of said face, said first area extending across said narrow width of said sidewall spacers and across said gate;

d) applying a second layer including titanium nitride or titanium tungsten over said first layer;

e) heating said body in an inert ambient at a temperature in a first range of 420° C. to 550° C. to cause formation of cobalt monosilicide by reaction of said first layer with silicon of said face in said exposed areas, said second layer acting to prevent formation of silicide over said narrow width of said sidewall spacers and to prevent oxidation of said cobalt monosilicide; and heating said body to a temperature in excess of said first temperature range to convert the cobalt monosilicide into cobalt disilicide.

7. A method according to claim 6 including the step of forming source/drain regions in said face on said opposite sides of said gate, by introducing impurities using said gate as a mask.

8. A method according to claim 7 wherein said body is P-type in said transistor area and said source/drain regions are N-type.

9. A method according to claim 7 wherein said body is N-type in said transistor area and said source/drain regions are P-type.

10. A method according to claim 6 wherein after said first step of heating, etching said face to remove said second layer and unreacted cobalt, then subjecting said wafer to said second heat treatment.

11. A method according to claim 6 wherein said first layer is of about 165 to 300 Å in thickness.

12. A method according to claim 11 wherein said second layer is about 50 to 150 Å in thickness.

13. A method according to claim 10 wherein said second heat treatment is at a temperature of no more than about 700° C.

14. A method of providing cobalt disilicide contacts over a semiconductor body comprising the steps of:

applying a first layer comprising cobalt to exposed areas of a semiconductor body comprising silicon:

applying a second layer including titanium nitride or titanium tungsten over said first layer;

heating said body at a temperature of 420° C. to 550° C. to cause formation of cobalt monosilicide on said semiconductor body; and heating said body to a temperature in excess of said first temperature range to convert the cobalt monosilicide into cobalt disilicide.

15. The method as recited in claim 14 wherein said second heating step further comprises the step of rapidly thermally annealing said cobalt monosilicide at a temperature of about 700° C. to convert said cobalt monosilicide into cobalt disilicide.

* * * * *